United States Patent [19]

Jacksen et al.

[11] Patent Number: 5,561,295

[45] Date of Patent: Oct. 1, 1996

[54] INFRARED-RESPONSIVE PHOTOCONDUCTIVE ARRAY AND METHOD OF MAKING

[75] Inventors: Niels F. Jacksen, Cave Creek; Mark K. Preis, Scottsdale, both of Ariz.

[73] Assignee: Litton Systems, Inc., Woodland Hills, Calif.

[21] Appl. No.: 283,394

[22] Filed: Jul. 29, 1994

[51] Int. Cl.[6] .................................................. H01J 31/49
[52] U.S. Cl. ................................ 250/338.4; 250/338.1
[58] Field of Search .............................. 250/338.4, 330, 250/332, 338.1

[56] References Cited

U.S. PATENT DOCUMENTS

| | | | |
|---|---|---|---|
| 3,958,121 | 5/1976 | Redman | 250/330 |
| 3,967,121 | 1/1976 | Redman | 250/330 |
| 5,286,976 | 2/1994 | Cole | 250/338.4 |

OTHER PUBLICATIONS

Article entitled: "Elements of Infrared Technology: generation, transmission, and detection"; p. 392, by Paul W. Kruse, Laurence D. McGlauchlin and Richmond B. McQuistan, published 1962 by John Wiley & Sons, Inc., New York London.

Primary Examiner—Davis L. Willis
Assistant Examiner—Richard Hanig
Attorney, Agent, or Firm—Poms, Smith, Lande & Rose

[57] ABSTRACT

A photoconductive detector array which is responsive to infrared light to provide an electrical output response includes a substrate which is transparent to infrared light. A continuous layer of photoconductive material is disposed upon the substrate, and a conductive grid disposed on the continuous layer of photoconductive material divides the photoconductive material electrically but not physically into plural detector areas. Electrical connection structure is provided for individual electrical contact with a central region of each one of the plural detector areas. A method of making a detector array according to the invention includes forming plural perforations through the continuous layer of photoconductive material to expose the substrate. The electrical connection structure includes contacts which are secured to the substrate through the photoconductive material and which effect electrical connection with this material for each one of the plural detector areas.

51 Claims, 4 Drawing Sheets

INFRARED-RESPONSIVE PHOTOCONDUCTIVE ARRAY AND METHOD OF MAKING

BACKGROUND OF THE INVENTION

1. Field of the Invention

This invention is in the field of apparatus which are responsive to photons of light to produce an electrical output response. More particularly, the present invention relates to a detector for providing an electrical response to infrared light. A detector array apparatus includes a multitude of such detectors, each of which is responsive to infrared light to produce an individual electrical signal. An optical system is generally used in connection with the array device to focus light from a distant scene to form an image. This image is directed upon the detector array, and the multitude of electrical signals provided by the detectors of the array then contain image information which was carried in the light falling upon the array. In the present case, the detectors and the array device are responsive to light in the infrared spectral band to produce an electrical signal carrying image information. Such infrared light is invisible to the human eye. Consequently, the light received by the detector array may be from a scene which is not visible to the natural vision of a human observer. However, the electrical signal from the detector array may be processed for display on a device, such as a video monitor, which provides a visible image for viewing by a human user of the device. Such a viewing process is generally referred to as thermal imaging, and the apparatus may be referred to as a thermal imager. A method of making the apparatus is also disclosed.

2. Related Technology

Conventional infrared detectors used for thermal imaging generally utilize materials such as Indium Antimonide (InSb), Mercury Cadmium Telluride (HCT), and Platinum Silicide (PtSi), which change their electrical characteristics in response to photons of light in the infrared spectral band. Because of this change in an electrical characteristic of some materials in response to infrared light, photoconductive materials can be used in detectors allowing current to flow and providing an electrical signal in response to light in the infrared spectral band. Such sensitivity to infrared light also allows these, and other, materials to be used in arrays of such detectors, which arrays will provide an electrical signal carrying image information from the light focused on the array. That is, the detectors, or pixels, of the detector array each receive light from a portion, or pixel, of a scene. The detector pixels each provide a corresponding portion of an electrical signal, which in analog or in digital form, carries the image information from the scene.

However, InSb, HCT, and PtSi sensors must be cooled to cryogenic temperatures (in the range of 77° K) in order to provide adequate sensitivity to infrared light. The substrate materials upon which the detectors of InSb and HCT material are fabricated are generally expensive. Additionally, the fabrication of some of these detectors requires use of epitaxial crystal growth, and of MOCVD (metal-oxide chemical vapor deposition) reactors. Thus, the fabrication and packaging of these conventional detectors and detector arrays is comparatively expensive and has a comparatively low yield of usable detectors and arrays.

A less expensive photoconductive material which has been used in detectors and in linear detector arrays is lead selenide (PbSe). This material is less expensive to use because it is not single-crystalline in nature and can be applied, delineated, electroded, and passivated with minimal processing, and with a high yield of usable detector arrays. This processing does not require the use of MOCVD reactors. Additionally, the substrate upon which the photoconductive PbSe material is carried can be relatively inexpensive quartz material.

Such conventional detectors and detector arrays generally employ the photoconductive material in the form of discreet tiles (or areas in plan view of the detectors) of the photoconductive material disposed on a surface of the substrate. With a linear detector array, the separations between the tiles simply prevent cross talk between adjacent detectors under dynamic conditions. The same is true of a two-dimensional array. Both linear and two-dimensional arrays incorporate discontinuities in the photoconductive material so that discreet detector elements are defined in both a physical and an electrical sense. These detector areas of photoconductive material are generally thin in comparison to their dimensions in the plane of the substrate surface upon which they are carried so that they might be visualized as discreet separated tiles upon a floor. These discreet tiles of the photoconductive material generally have electrodes or electrical leads connected to opposite sides of the photoconductive material so that in response to the receipt of infrared light photons and a resulting change in the conductivity of the material, a changed current level will flow between these electrodes or electrical leads. This change in the electrical current level is used to provide the electrical output signal from the detector or detector array.

However, conventional photoconductive detectors and detector arrays, including those which used PbSe material, have suffered from a lower than desired signal-to-noise (SN) ratio. This low SN ratio is believed to be caused in part by the edges of the detector tiles, to which no electrical connection is made, interrupting equipotential lines in the photoconductive material. That is, an "edge" of such a detector tile might be viewed as a physical boundary or plane which transects or cuts equipotential lines of the photoconductive material. At such an edge of the detector, the current flow perpendicular to the equipotential lines along the edge of the detector is non-uniform and not proportional to any input signal, and thereby constitutes a source of noise.

Photoconductive detectors are generally compared by using a parameter known as the D* (d-star) detectivity figure of merit. This D* parameter includes a factor for SN ratio, as well as the bandwidth and active area of the detector. Consequently, all conventional detectors suffer a reduction in their performance rating because of the edge noise created by the discreet photoconductive detector tiles of the detectors.

Another disadvantage of conventional detectors which have discreet tiles of photoconductive material is that the necessary separations between the detector tiles uses a significant portion of the available area on the substrate. Consequently, only a fractional portion of the substrate surface is actually used by the active detector tiles. This comparatively smaller area of the substrate, which is the active area of the detector because it carries the tiles of photoconductive material responsive to the incident infrared light, means that conventional detectors also have a decreased fill factor, which is defined as the ratio of the active detection area to the total available area of the pixel.

SUMMARY OF THE INVENTION

In view of the deficiencies of conventional photoconductive detectors and detector arrays, it is a primary object for this invention to avoid one or more of these deficiencies.

Further, it is an object for this invention to provide a photoconductive detector and detector array which is free of edges in the photoconductive response.

A further object for this invention is to provide such a photoconductive detector and detector array which has an improved signal to noise ratio.

Still another object for this invention is to provide such a photoconductive detector and detector array which has an improved area ratio of the detector substrate surface which is available for photoconductive response.

Another object for this invention is to provide such a photoconductive detector and detector array in which the detectivity parameter (D*) is improved with increased signal-to-noise ratio.

Yet another object for this invention is to provide a two-dimensional PbSe detector array with sufficiently small dimensions for its detector elements that it is competitive with other conventional detector materials.

Accordingly, the present invention provides a photoconductive detector having a substrate, a continuous layer of photoconductive material disposed upon the substrate, a conductive grid disposed on the continuous layer of photoconductive material and electrically but not necessarily physically bounding a detector area within the continuous layer of photoconductive material, and electrical means for making electrical contact with a central region of the detector area.

According to another aspect, the present invention provides a photoconductive detector array having a substrate, a continuous layer of photoconductive material disposed upon the substrate, a conductive grid disposed on the continuous layer of photoconductive material and electrically but not necessarily physically dividing the continuous layer of photoconductive material into plural detector areas, and electrical means for making individual electrical contact with a central region of each one of the plural detector areas.

An advantage of a detector or detector array according to the present invention is that the detector or array is free of edges. Accordingly, an improved signal to noise ratio is provided by the detectors and arrays according to the invention. Also, an improved area ratio of the substrate which carries photoconductive material results from the invention. That is, the substrate does not carry discreet separated tiles of photoconductive material, but carries a continuous layer of photoconductive material. A larger proportion of this continuous layer of photoconductive material is active as detector area than could be the case with discreet separated tiles of the material.

These and other objects and advantages of the present invention will be apparent from a reading of the following detailed description of a particularly preferred exemplary embodiment of the invention, taken in conjunction with the appended drawing Figures.

BRIEF DESCRIPTION OF THE DRAWING FIGURES

FIGS. 1A and 1B provide respective plan views of a connection face and of a light-reception face of a detector array embodying the present invention;

FIG. 2 is a greatly enlarged fragmentary perspective view of the detector array seen in FIG. 1A, taken from the connection face side of the detector array, and having portions of the structural layers and features of the detector array broken away and removed for clarity of illustration;

FIG. 3 provides a greatly enlarged fragmentary cross sectional view taken generally at the line 3—3 of FIG. 2, and illustrating the structure of a detector of the array; and FIGS. 4–9 provide fragmentary cross sectional views illustrating steps in the process of making a detector array according to the invention.

FIGS. 10–12 show alternative topological configurations for a detector array according to the present invention.

DETAILED DESCRIPTION OF A PREFERRED EXEMPLARY EMBODIMENT OF THE INVENTION

Figure 1A:
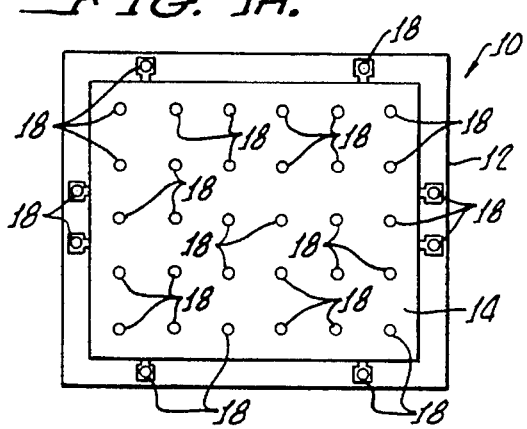
Figure 1B:
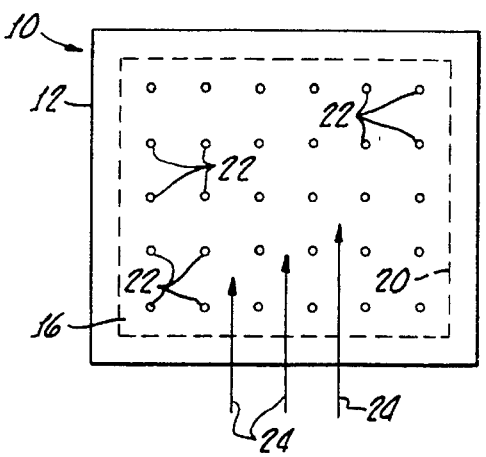

Viewing FIGS. 1A and 1B, respective a two-dimensional, photoconductive, infrared-light sensitive detector array 10 is depicted. This detector array 10 includes a relatively thin flat body 12 with a connection face 14 and a light-reception face 16 when viewed in plan. The detector array body 12 is relatively thin and flat, as will be seen, and outwardly has a plurality of electrical contact pads 18 arrayed both centrally in a regular grid pattern, and also around the perimeter of the body 12 on the connection face 14. On the light-reception face 16, the body 12 includes a centrally-located window portion 20, which is transparent to infrared light. The window portion 20 would not ordinarily be transparent to visible light, However, for purposes of illustration and clarity of description only, the window portion 20 is depicted in FIG. 1B as though it were transparent to visible light. Accordingly, visible in FIG. 1B through the window portion 20 is a plurality of regularly arrayed bonding pads 22, the function of which will become clear from the following description. The locations of the bonding pads 22 will be noted as congruent with the locations of the contact pads 18 which are centrally located on the face 14. These bonding pads 22 and the congruent centrally located ones of the contact pads 18 will be seen to be individually electrically continuous with each other. As will be seen, the detector array 10 is responsive to photons of infrared light received through window portion 20, as is represented by the arrowed reference numerals 24 on FIG. 1B, to provide an electrical output signal response via the contact pads 18.

Figure 2:
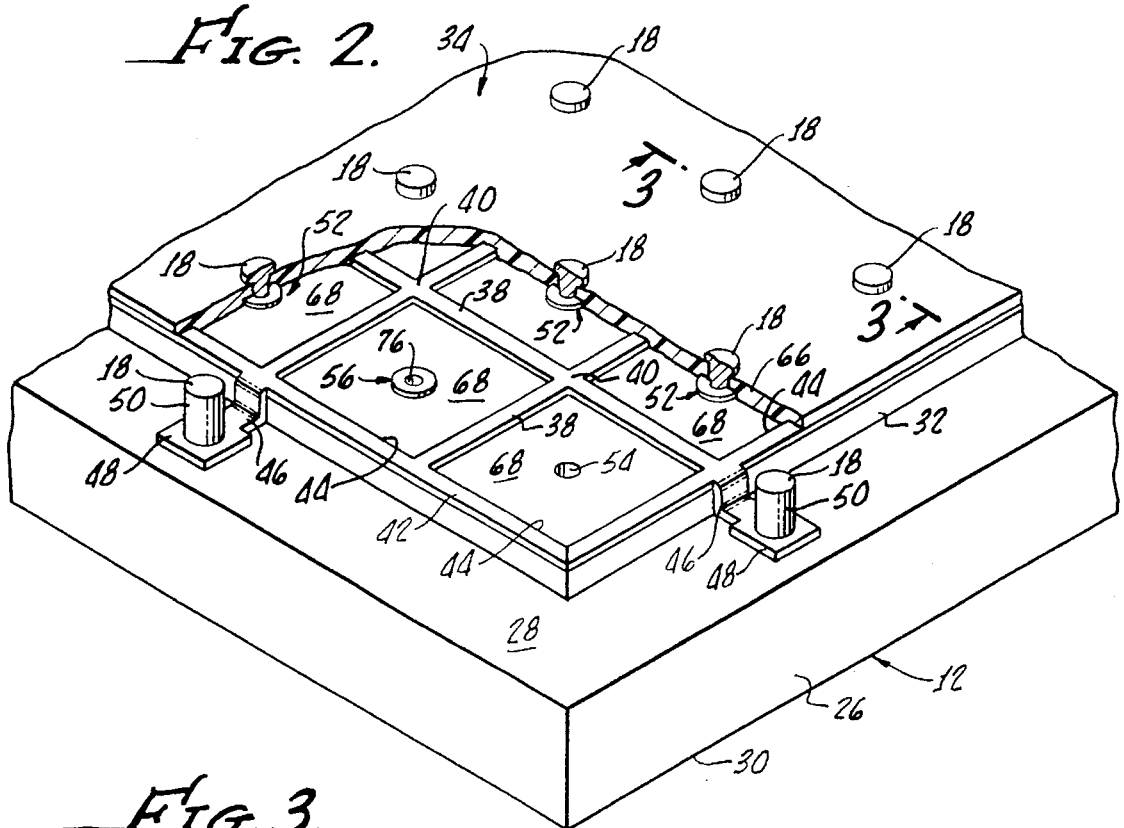

FIG. 2 depicts certain structural features of the detector array 10 as though they were broken away or removed for clarity of illustration. Viewing FIGS. 2 and 3, it is seen that the detector array 10 includes a substrate 26. This substrate 26 is preferably z-cut crystalline quartz, and is transparent to infrared light. The substrate 26 includes a connection face 28, and light-reception face 30, each corresponding to the respective faces of the detector array 10. On the connection face 28 of the substrate 26 is disposed both the peripheral plurality of contact pads 18, and a continuous layer 32 of photoconductive lead selenide (PbSe). By photoconductive is meant that the layer of PbSe becomes locally more conductive in response to a flux of infrared light in a particular spectral band (recalling photons 24). The PbSe material of the layer 32 is conventionally sensitized to increase its conductivity-change response to infrared light in a particular operating temperature range. The PbSe layer 32 is preferably only a few microns thick (i.e., preferably, the layer 32 is only one or two microns thick), and is continuous within an area (indicated with the numeral 34 on FIG. 2), which is congruent with the window portion 20 on the other (light-reception) face 16 of the body 12. The layer 32 of PbSe material may cover a larger area on the face 28 than the size of the window portion 20 on face 16.

Carried on and in electrical contact with the layer 32 of photoconductive PbSe material is a metallic conductive grid 36. This grid 36 has a plurality of orthogonal conductive stringers or traces 38, which intersect and contact one another at nodes 40 where their paths cross. The grid 36 also includes a perimeter frame portion 42 to which the conductive traces 38 connect, and also defines a regular rectangularly-arrayed plurality of rectangular openings 44. As depicted, the openings 44 are square or substantially square. A number of lead portions 46 (only two of which are visible in FIG. 2) extend from the frame portion 42 of the grid 36 outwardly onto the face 28 of the substrate 26. These leads 46 terminate in pad supports 48. Upon each one of the pad supports 48 is carried a raised indium contact 50, which at its upper end defines a respective one of the contact pads 18. The contact pads 18 which are carried on the pad supports 48 will be used to make a common electrical connection to the detectors of the detector array 10, as will be further explained.

Centrally located within each opening 44 of the grid 36 is a respective contact structure 52, the protruding portion of which defines a respective one of the electrical contact pads 18 seen within the area congruent with the window portion 20. The contact structures 52, include the bonding pads 22 which were visible through the window portion 20 viewing FIG. 1B. These electrical contact structures 52, which are centrally disposed within the area congruent with the window portion 20, are in fact an assembly of several layers of metal selected for their compatibility; resistance to diffusion into the active layer 32 of PbSe material or into one another; ability to mechanically and metallurgically bond to the quartz substrate 26, as will be further explained; or ability to bond to other structure, as also will be further explained. The contact structures 52 will be used to effect individual electrical connection to the detectors of the detector array 10. All of the contact structures 52 and contacts 50 may have a common height so that the detector 10 can be mounted to a substrate using surface mount techniques, with the window portion 20 directed outwardly to receive infrared light. On the other hand, in view of the malleable nature of indium metal, as will be seen, the contacts 18 may be electrically connected with other structures without the contacts 50 and contact structures 52 having the same height.

Figure 3:
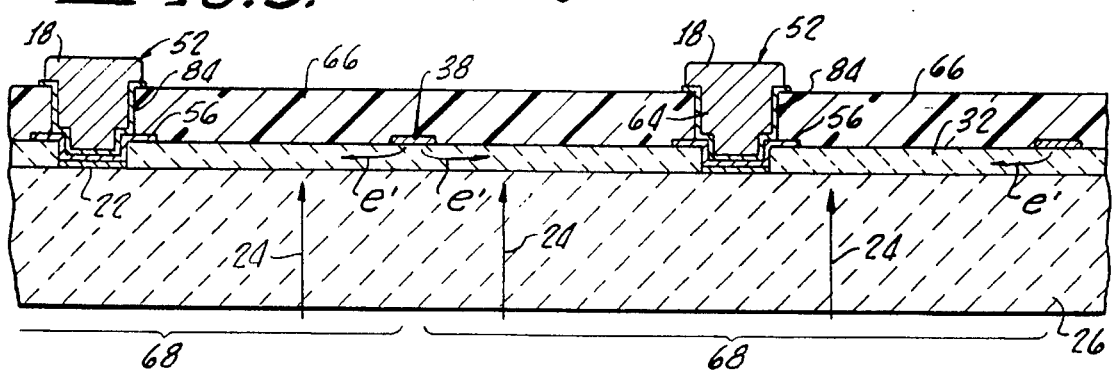

Further viewing FIGS. 2 and 3, and particularly the foreground portion of FIG. 2, it is seen that the continuous layer 32 of PbSe material defines a hole 54 congruent with each contact structure 52. The hole 54 receiving a part of the respective contact structure 52. These holes 54 extends through the layer 32 of PbSe material to expose the quartz substrate 26. Within the holes 54 are disposed the respective bonding pads 22, which was visible through the window portion 20, recalling again the description of FIG. 1B. Preferably, these bonding pads 22 are a thin layer of chromium metal. The bonding pads 22 engage and bond to the exposed quartz substrate 26. Chromium metal is particularly preferred for this use because it has the ability to bond securely to the quartz of the substrate 26. However, other materials, such as titanium metal or tungsten metal, could be used to form a bond pad on the substrate 26.

On the bonding pads 22 and within the holes 54 of the PbSe layer 32, the contact structure 52 includes an interface layer 56 of gold metal. The interface layer 56 is generally hat-shaped, and includes a lower wall portion 58 on the bonding pad 22, a side wall portion 60 contacting the layer 32 of PbSe, and a radially extending flange portion 62 extending a small distance outwardly on the surface of the PbSe layer 32 around hole 54. As will be seen, at the same time that the interface layer 56 of gold metal is applied to the contact pads 22 and in the holes 54, the grid 36 is applied on the PbSe layer 32. The gold metal of the grid 36 does not bond to the PbSe material because this material is rather flocculent. However, the grid 36 is of a thin-film structure, and is not subject to forces which would dislodge its electrical and mechanical interface with the PbSe material of the layer 26. Accordingly, the grid 36 is satisfactorily secure upon the layer 26 of PbSe material. The contact structure 52 is secured to the quartz substrate by the bond of the bond pad 22 to the quartz material, and the bonding of the gold interface layer 56 with the bond pad 22.

Within the hat-shaped gold interface layer 56 and extending upwardly therefrom to define at its upper end a respective one of the centrally-located contacts 18 is a column 64 of indium metal. Like the contacts 50, the columns 64 may be thermally reflowed or mechanically cold reflowed to effect a surface mount (i.e., a flip-chip mount) of the detector array 10, for example, to a supporting circuit board or to another chip (not shown). The indium metal of the contacts 18 is sufficiently malleable to allow a cold pressure-reflow process to be used to mechanically and electrically interface the detector array 10 with another circuit board or chip. Importantly, the indium metal of the columns 64 is isolated from the PbSe material of the layer 26 by the chromium metal of the bond pads 22, by the interposed gold metal of the interface layer 56, and by a passivating layer, as will be explained. Also, a diffusion-barrier layer of palladium metal is interposed between the gold interface layer 56 and the indium metal of the columns 64, as will be explained.

Further viewing FIGS. 2 and 3, it is seen that a layer 66 of passivating and insulating material covers both the active layer 32 of PbSe, and the metallic conductive grid 36. The electrical contact structures 52, however, extend through this layer 66 to define the centrally located contacts 18, as was pointed out above. The passivating layer 66 may be made of a suitable material. For example, the traditional passivating material, AsSe (arsenic selenide) is acceptable for making the layer 66. Alternatively, silicon nitride, silicon monoxide, zinc selenide, CV-Diamond or diamond-like film (i.e., chemical vapor deposited diamond-like material), or polyimide material may be used to make the passivating layer 66. Further by way of example only, the polyimide material sold by Olin-Cieba Geigi under the trade name of Probimide 412 is believed to be satisfactory for forming the passivating layer 66.

Viewing FIG. 3, it is seen that the layer 32 of PbSe material is continuous. That is, all parts of the layer 32 are electrically conductive with one another. However, the grid 36 effectively divides the layer 32 electrically (but not physically) into detector areas 68. For purposes of illustration only, if it is assumed that the grid 36 is negatively charged relative to the contact structures 52, then a flux of infrared light 24 will result in electrons (indicated with the arrowed lead lines and the characters e⁻ on FIG. 3) leaving the grid 36 and being conducted within the PbSe material of the layer 32 to the contact structure 52 located in the center of each grid opening 44. Although the layer 32 of PbSe material is continuous, the adjacent detector areas 68 do not "cross talk" to one another because of the distinct potential fields established between the grid 36 and each contact structure 52. In other words, equipotential lines do not extend between or cross from one detector area 68 to another. As can be seen viewing FIG. 3, the area of layer 32 which is not active in responding to the light flux 24 is very small. The grid 36 and bond pads 22 do slightly decrease the active area of the layer 32 within the area of window 20. However, the remaining active area of the layer 32 is much greater than conventional detectors which use discreet detector areas. With a 50 micron detector size (square detectors), the applicants believe that the present invention will provide a detector array with as much as a 67 percent fill factor. That is, 67 percent of the area of the PbSe layer within the light-receiving window of the detector array can be responsive to received infrared light. Such a high fill factor can only be achieved with conventional detector arrays of discreet detectors by using high-cost alternative technologies.

Also importantly, the detector areas 68 are "edge-less". That is, there are no equipotential lines in the PbSe material which cross or intersect with boundaries or physical planes in the array to generate noise. Consequently, the applicants believe that a detector array according to the present invention will have a considerably better D* parameter of detectivity than conventional PbSe photoconductive detector arrays.

Figure 4:
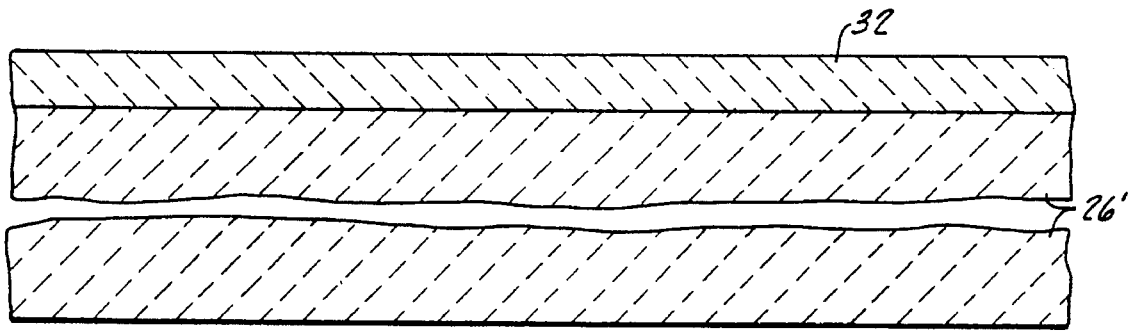

Viewing now FIGS. 4–9 in sequence, salient steps in the process of making a detector array according to the invention are illustrated. Viewing first Figure, it is seen that the process of making a detector array according to the invention starts with the provision of a substrate work piece 26'. Preferably, the substrate work piece 26' is Z-cut quartz. This substrate work piece 26' is considerably thicker than the substrate 26 in order to provide ruggedness for handling during processing. However, at a later stage of processing, the thickness of this substrate work piece 26' will be reduced by removing material from the lower side of this work piece as seen in FIG. 4, so that the thin substrate 26 carrying the detectors 68 and contacts 18, etc., is provided as part of a finished detector array 10. This reduction in the thickness of the substrate work piece 26' to provide the substrate layer 26 also considerably improves the transparency of the substrate 26 to infrared light in the spectral band where PbSe is sensitive to infrared light (i.e., in the 3 to 5 micron range).

FIG. 4 shows that a continuous layer 32 of PbSe material is applied over the substrate work piece 26' in an area at least congruent with and covering the area of the window portion 20 of the detector array 10. The PbSe layer 32 can be larger than the active part (i.e., larger than window portion 20) of the detector array 10, if desired.

Figure 5:
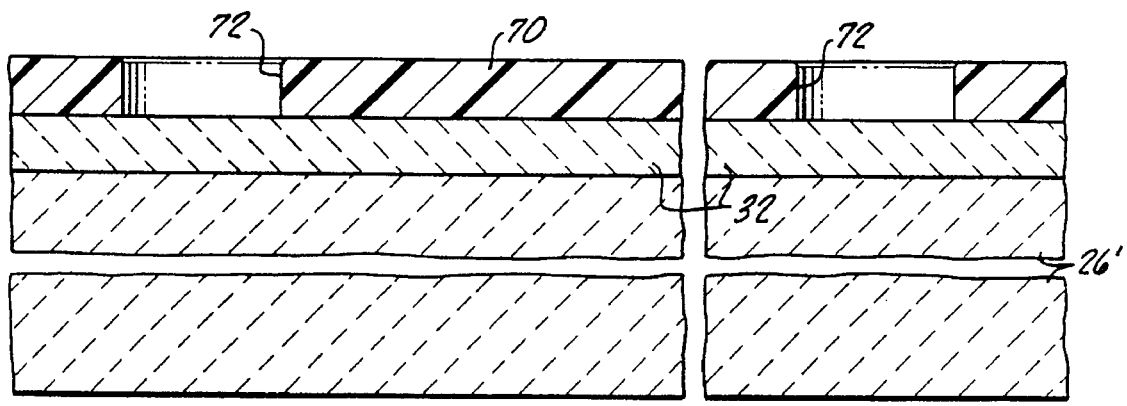

FIG. 5 shows that atop the layer 32 of PbSe, a layer 70 of photoresist material is provided. This layer 70 of photoresist is exposed and partially removed to leave a plurality of openings 72, which are in a regular rectangular array at the eventual locations for the bonding pads 22. That is, the locations of the openings 72 corresponds to the locations for the electrical contact structures 52.

Figure 6:
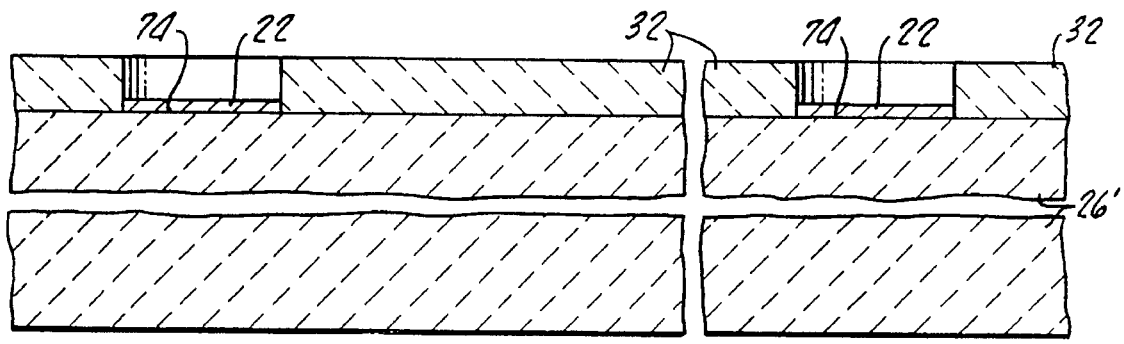

FIGS. 5 and 6 in conjunction show that in the openings 72, the layer 32 of PbSe material is etched away to create the corresponding opening 54 and to expose the surface 74 of the substrate work piece 26'. Through the openings 72 in this layer 70 of photoresist, the bonding pads 22 are applied. The bonding pad 22 may be made of chromium metal, or of another material as pointed out above, and may be applied, for example, by sputtering or similar thin film deposition processes. The chromium metal or other material of the bonding pads 22 is used because of its ability to bond securely to the quartz material of the substrate work piece 26. Next, viewing FIGS. 5, 6, and 7 in conjunction, the result of another patterning of this same layer of photoresist and another application of metal material is shown. The layer 70 of photoresist is again patterned and partially removed to form the pattern for the grid 36. At the same time, the openings 72 in the layer of photoresist 70 aligned with the holes 54 (now including the bonding pads 22), remain in the layer of photoresist and are slightly enlarged for a purpose to be explained.

Figure 7:
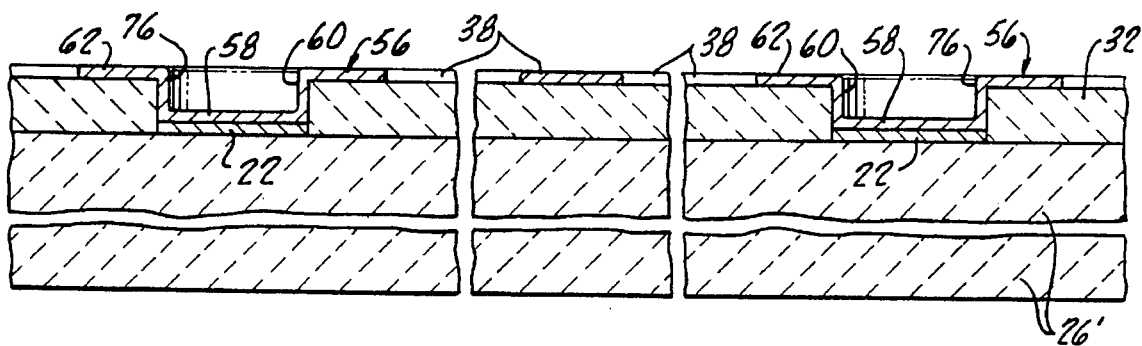
Figure 8:
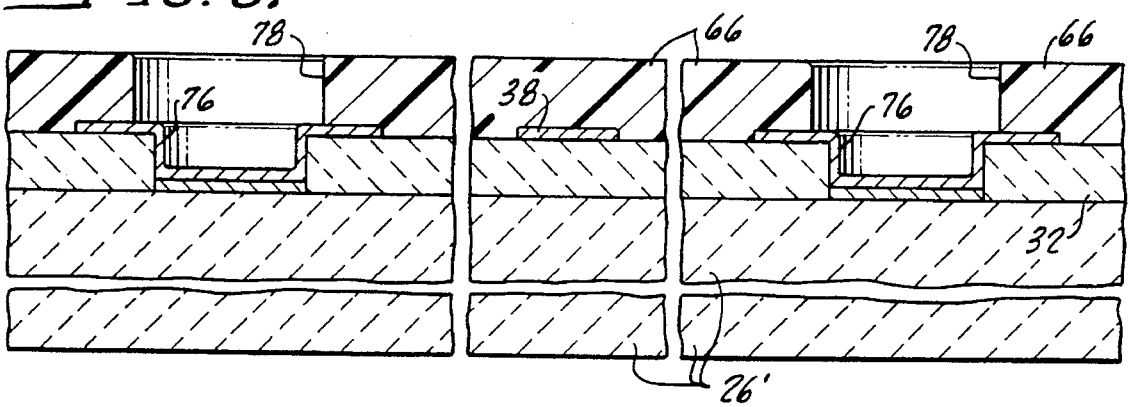

FIG. 7 shows that through the enlarged openings 72, over the bonding pads 22, in and around the holes 54 of the PbSe layer 32, and in the pattern for the grid 36, gold metal is applied. That is, this layer of gold metallic material is patterned in two electrically separate but simultaneously applied parts. One part of the gold metallic material creates the grid 36, as is seen in FIGS. 2, and 7. The other part of the gold metallic material which is simultaneously applied through the enlarged openings 72 and into the holes 54 of the PbSe layer 32 onto the bond pads 22 to create lower wall 58, also extends along the surface of the PbSe layer 32 which defines the hole 54 to create side wall 60, and extends a short distance radially around the hole 54 because of the enlargement of the openings 72 to form the flange portion 62. Thus, the gold material at holes 54 is formed in the inverted hat-like shape of the gold interface layers 56. It is seen that the gold interface layer 56 on each bonding pad 22 defines a recess or opening 76. This opening 76 will indirectly receive the indium material defining the columns 64 for the contact structures 52. The layer 70 of photoresist which was used to define the bonding pads 22, grid 36 and interface layers 56 is subsequently removed.

In order to prepare for formation of the indium columns 64 while protecting the PbSe material of layer 32 from contamination by this indium material, layer 66 of passivating material is formed. Alternative process steps may be used dependent upon whether polyimide or another passivating material is used to form the passivating layer 66. If a material other than polyimide is used, a layer of photoresist (not shown) is placed over the structure seen in FIG. 7. This layer of photoresist is exposed and partially removed in a pattern leaving only a comparatively thick dot of the photoresist material on each interface layer 56 of gold. This remaining dot is slightly smaller in diameter than the flange portion 62 of the gold interface layers 56. Next, to create the structure seen in FIG. 8, the layer of passivating material 66 is applied over the structure created. This layer of passivating material 66 may be thermally evaporated or sputtered, depending on the material selected. The unwanted passivating material along with the photoresist is than removed using a suitable solvent, leaving openings 78 in the passivating layer 66.

Alternatively, if a photosensitive polyimide is used to form the passivating layer 66, then the photo-reactive nature of this material itself may be used to form the openings 78. The entire face 14 of the array 10 is coated with polyimide, and the part of the polyimide material which is to remain is exposed. The unexposed polyimide material is removed with a suitable solvent, leaving openings 78. The polyimide is then cured, using an appropriate cure cycle that does not degrade device performance.

Figure 9:
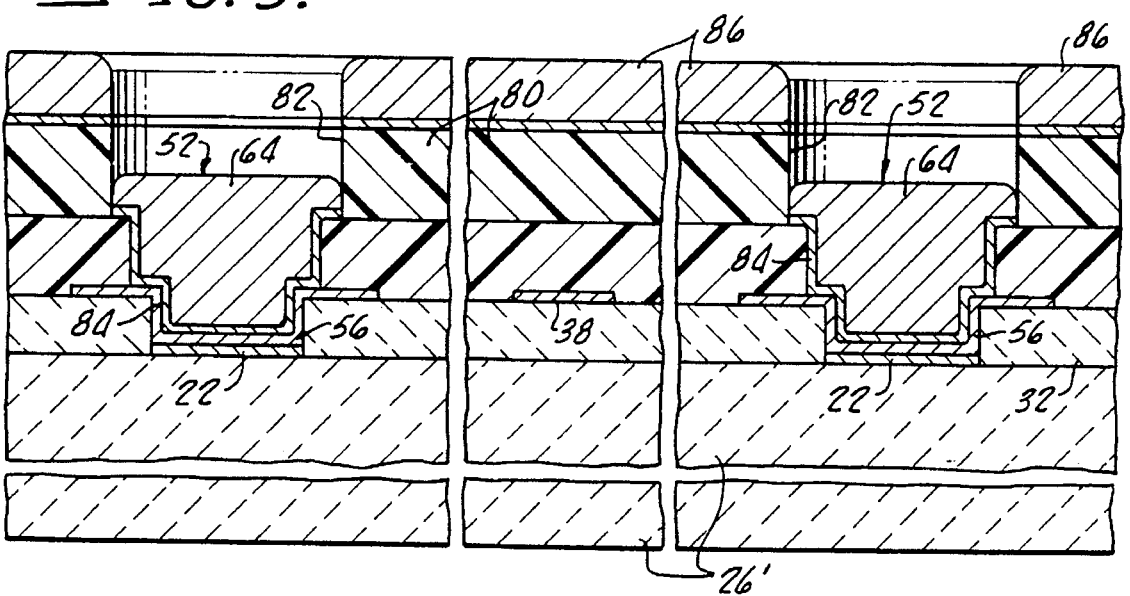

FIG. 9 shows that a layer 80 of photoresist material is next applied on the structure created by the steps explained above. This layer 80 of photoresist is exposed, and is partially removed to create openings 82 aligned with but of a larger diameter than the openings 78 in the passivating layer 66. First, palladium and then indium metal is applied over the photoresist material of layer 80. The palladium metal is deposited in a thin layer, which is referenced with the numeral 84. This thin layer 84 of palladium metal serves as a diffusion barrier between the gold metal of interface layer 56 and the indium metal which will form columns 64. The indium metal is next applied in a much heavier layer, and is deposited into the aligned openings 76, 78, and 82 to form the columns 64 of contact structures 52. The remaining palladium and indium metal (generally referenced with the numeral 84 on FIG. 9), along with the layer 80 of photoresist material, is removed using a solvent lift-off process. The columns 50 and 64 of indium metal may then equalized in height (if desired) so that the tops of these columns are all in a common plane to define the contacts 18. Substrate work piece 26' is then thinned to make the resulting substrate 26 more transparent to infrared light, as was explained above. The detector array structure 10 seen in FIGS. 2 and 3 results from the above-described manufacturing process.

Figure 10:
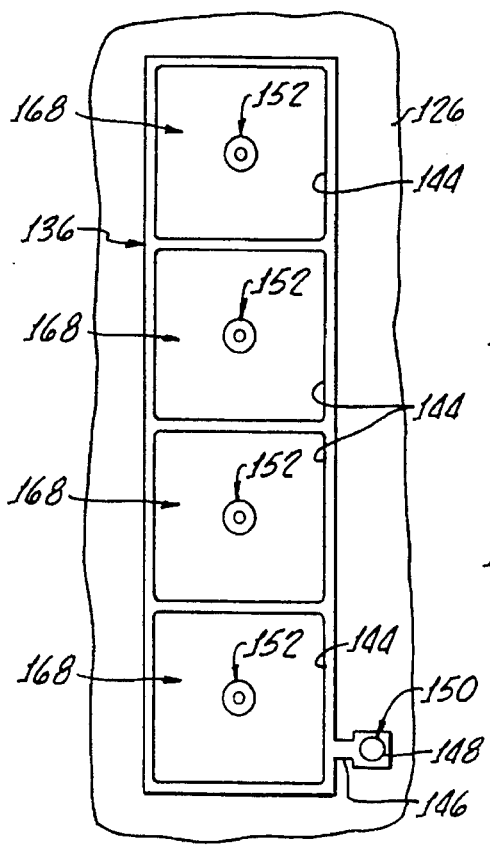
Figure 11:
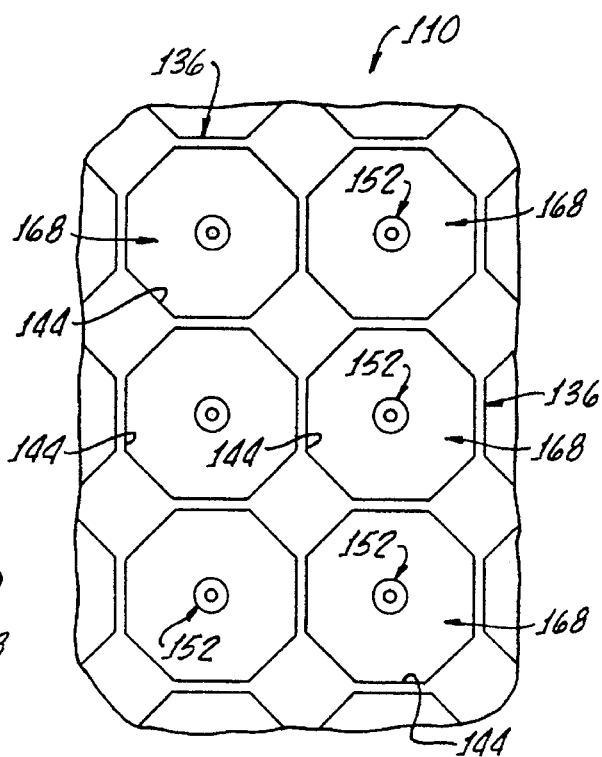
Figure 12:
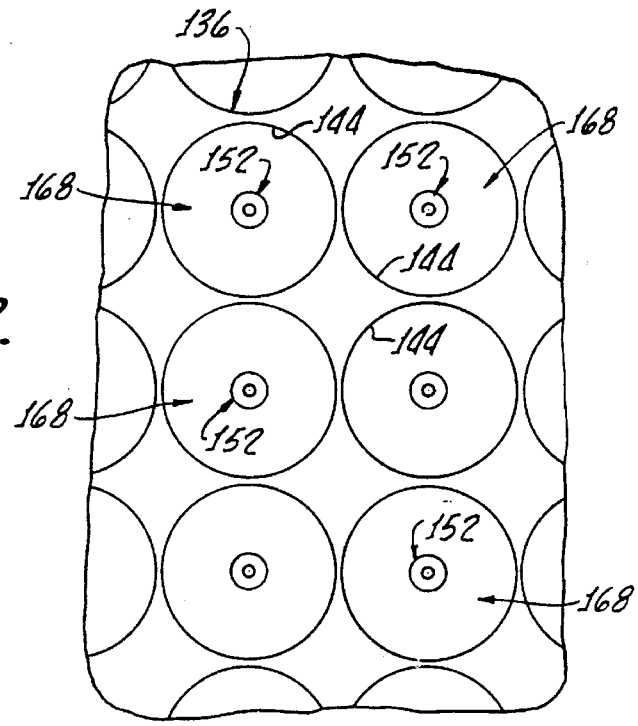

FIGS. 10, 11, and 12 schematically show alternative topological configurations for a detector array according to the present invention. In order to obtain reference numerals for use in describing the structures depicted in the following drawing Figures, features which are the same as, or which are analogous in structure or function to, the features depicted and described above are referenced on the following drawing Figures using the same numeral used above and increased by 100. FIG. 10 shows that a detector array 110 according to the present invention can be configured as a linear array. In this case, the array 110 include a grid 136 which is linear rather than two-dimensional. That is, the grid 136 defines only a single row of detector areas 168.

FIGS. 11 and 12 show that a two-dimensional detector array 110 according to the present invention can alternatively define detector ares 168 which are other than square. That is, the detector areas 168 may be octagonal (FIG. 11) or round (FIG. 12) in shape. The shapes of the active detector areas 68 and 168 depends only on the shape of the openings defined by the grid 36. Thus, a wide variety of shapes and configurations for the detector array 10 is possible. For example, the detector array could be configured with nested hexagonal detector areas arranged like an honey comb.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

We claim:

1. An edge-less photodetector comprising:
   a substrate;
   a continuous layer of material which is responsive to photons of light to change an electrical characteristic of the material, said continuous layer of material being disposed upon said substrate;
   a conductive grid disposed on the continuous layer of material and electrically but not physically dividing a detector area of said material from the remainder of said continuous layer of material; and
   electrical means for making electrical contact with a central region of said detector area.

2. The photodetector of claim 1 wherein said electrical means for making electrical contact with a central region of said detector area includes a contact structure secured to said layer of material.

3. The photodetector of claim 2 wherein said contact structure is secured to said layer of material by a layer of metallic material also bonding to said substrate.

4. The photodetector of claim 3 wherein said layer of metallic material includes a metal selected from the group including chromium, titanium, and tungsten.

5. The photodetector of claim 3 wherein said continuous layer of material defines an opening centrally of said detector area, said opening exposing a surface of said substrate, and said layer of metallic material bonding with said surface of said substrate within said opening.

6. The photodetector of claim 3 wherein said contact structure further includes a column of conductive material carried upon said layer of metallic material and extending outwardly of said photodetector.

7. The photodetector of claim 6 wherein said column of conductive material includes indium metal.

8. The photodetector of claim 6 wherein said contact structure further includes a layer of interface metal interposing between said metallic material and said column of conductive material.

9. The photodetector of claim 8 wherein said layer of interface metal includes gold metal.

10. The photodetector of claim 9 wherein a layer of palladium metal is interposed between said interface layer of gold metal and said column of conductive material.

11. The photodetector of claim 1 wherein said conductive grid defines plural openings, each one of said plural openings of said conductive grid substantially defining one of a respective plurality of detector areas.

12. The photodetector of claim 11 wherein said conductive grid defines openings having a shape selected from the group including rectangular, square, octagonal, and round.

13. The photodetector of claim 11 further including means for electrically connecting said conductive grid to electrical circuitry external of said photodetector.

14. The photodetector of claim 13 wherein said means for electrically connecting said conductive grid to electrical circuitry external of said photodetector includes a contact pad carried by said substrate.

15. The photodetector of claim 11 further including means for electrically connecting each one of said plural detector areas individually to electrical circuitry externally of said detector.

16. The photodetector of claim 15 wherein said means for electrically connecting each one of said plural detector areas individually to electrical circuitry externally of said detector array includes a plurality of contact structures individually secured to said continuous layer of material in electrical contact centrally of respective ones of said plurality of detector areas.

17. The photodetector of claim 15 wherein each of said plurality of contact structures is also secured to said continuous layer of material by a respective bond layer of metallic material also bonding to said substrate.

18. The photodetector of claim 17 wherein said bond layer of metallic material includes a metal selected from the group including chromium, titanium, and tungsten.

19. The photodetector of claim 17 wherein said continuous layer of material defines an opening centrally of each one of said plurality of detector areas, said openings exposing a respective portion of a surface of said substrate, and said bond layer of metallic material extending through said respective opening to bond with said surface of said substrate.

20. The photodetector of claim 19 wherein each of said plurality of contact structures further includes a respective column of indium metal carried upon said layer of metallic material and extending outwardly of said detector, a respective layer of interface metal interposing between said column of indium metal and said bond layer of metallic material.

21. The photodetector of claim 20 wherein said layer of interface metal includes a layer of gold metal.

22. The photodetector of claim 21 wherein a layer of palladium metal is interposed between said interface layer of gold metal and said column indium metal.

23. An edge-less photoconductive lead selenide (PbSe) detector array for receiving infrared light and providing an electrical output response, said detector array comprising:
- a substrate of quartz material having a window portion which is transparent to infrared light;
- a continuous layer of photoconductive PbSe material disposed upon said substrate congruent with said window portion;
- a conductive metallic grid disposed on said continuous layer of photoconductive PbSe material, said conductive metallic grid electrically dividing said continuous layer of PbSe material into plural detector areas;
- a layer of passivating material overlying said layer of PbSe material and said conductive metallic grid thereon; and
- a respective plurality of electrical contact structures extending through said layer of passivating material and each making individual electrical contact with a central region of a respective one of the plural detector areas.

24. The edge-less photoconductive lead selenide detector array of claim 23 wherein said continuous layer of PbSe material defines a respective plurality of holes therethrough centrally of said detector areas, each one of said plurality of holes receiving a portion of a respective one of said plurality of contact structures.

25. The edge-less photoconductive lead selenide detector array of claim 24 further including a respective plurality of bonding pads disposed respectively one in each one of said plurality of holes and bonding to said substrate.

26. The edge-less photoconductive lead selenide detector array of claim 25 wherein each of said plurality of bonding pads is interposed between said contact structure and said substrate and bonds to each.

27. The edge-less photoconductive lead selenide detector array of claim 26 wherein said bonding pads includes a metal selected from the group including chromium, titanium, and tungsten.

28. The edge-less photoconductive lead selenide detector array of claim 26 further including an interface layer of metallic gold interposed between each of said plurality of bonding pads and said contact structure.

29. The edge-less photoconductive lead selenide detector array of claim 28 wherein said interface layer of metallic gold is generally hat-shaped to include a lower wall bonding with a respective one of said bonding pads, a side wall contacting said layer of PbSe material, and a flange portion extending radially outwardly around the respective one of said plural holes in said layer of PbSe material.

30. The edge-less photoconductive lead selenide detector array of claim 29 further including a layer of metallic palladium interposed between said interface layer of gold metal and said contact structure, said layer of metallic palladium also interposing between said layer of passivating material and said contact structure.

31. The edge-less photoconductive lead selenide detector array of claim 23 wherein said contact structure includes a column of metallic palladium.

32. A method of making an edge-less photoconductive lead selenide (PbSe) detector array for receiving infrared light and responsively providing an electrical output signal, said method comprising the steps of:
- providing a substrate of quartz material having a portion which is transparent to infrared light;
- providing a continuous layer of photoconductive PbSe material upon said substrate congruent with said transparent portion thereof;
- providing a conductive metallic grid disposed on said continuous layer of photoconductive PbSe material;
- utilizing said conductive metallic grid to electrically divide said continuous layer of PbSe material into plural detector areas; and
- providing a respective plurality of electrical contact structures each making individual electrical contact with a central region of a respective one of said plural detector areas.

33. The method of claim 32 further including the step of providing a layer of passivating material overlying said layer of PbSe material and said conductive metallic grid.

34. The method of claim 33 further including the step of defining a respective plurality of holes through said layer of PbSe material, locating each one of said plurality of through holes centrally of a respective one of said plurality of detector areas, and receiving a portion of a respective one of said plurality of contact structures into each one of said plurality of through holes.

35. The method of claim 34 further including the step of including a respective plurality of bonding pads each disposed respectively in one of said plurality of through holes, and employing said plurality of bonding pads to secure said plurality of contact structures to said substrate.

36. The method of claim 35 further including the step of interposing said plurality of bonding pads between said contact structure and said substrate, and bonding each one of said plurality of bonding pads to each of said substrate and to a respective one of said plurality of contact structures.

37. The method of claim 36 further including the step of forming said plurality of bonding pads from a metal selected from the group including chromium, titanium, and tungsten.

38. The method of claim 36 further including the step of providing an interface layer of metallic gold interposed between each of said plurality of bonding pads and the respective one of said plurality of contact structures.

39. The method of claim 38 further including the steps of providing a layer of metallic palladium interposed between said interface layer of gold metal and the respective one of said plurality of contact structures, and also interposing said layer of metallic palladium also interposing between said layer of passivating material and respective ones of said plurality of contact structures.

40. The method of claim 32 further including the step of providing a column of metallic palladium as part of each one of said plurality of contact structures.

41. An edge-less lead selenide (PbSe) photodetector for receiving infrared light and responsively providing an electrical output signal, said photodetector comprising:
- a substrate of quartz material which is transparent to infrared light;
- a layer of photoconductive PbSe material disposed on said substrate, said layer of PbSe material being continuous over an area of said substrate which is larger than said photodetector, said layer of PbSe material being responsive to photons of infrared light to change in electrical conductivity;
- a conductive metallic grid disposed on said layer of PbSe material and electrically but not physically dividing said photodetector from the remainder of said layer of PbSe material;
- a layer of passivating material overlying said layer of PbSe material and said conductive metallic grid; and an electrical contact structure extending through said layer of passivating material and making electrical contact with a central region of said detector area.

42. The photodetector of claim 41 wherein said conductive grid defines plural openings, each one of said plural openings of said conductive grid substantially defining one of a respective plurality of photodetectors.

43. The photodetector of claim 41 wherein said electrical contact structure is secured to said layer of PbSe material and to said substrate of quartz material.

44. The photodetector of claim 43 wherein said electrical contact structure is secured to said layer of PbSe material and to said substrate of quartz material by a layer of metallic material bonding to both said substrate quartz material and to said layer of PbSe material.

45. The photodetector of claim 44 wherein said layer of metallic material includes a metal selected from the group including chromium, titanium, and tungsten.

46. The photodetector of claim 43 wherein said continuous layer of PbSe material defines an opening centrally of said photodetector, said opening exposing a surface of said quartz substrate material, and said layer of metallic material bonding with said surface of said quartz substrate material within said opening.

47. The photodetector of claim 44 wherein said contact structure further includes a column of conductive material carried upon said layer of metallic material and extending outwardly of said photodetector through said layer of passivating material.

48. The photodetector of claim 47 wherein said column of conductive material includes indium metal.

49. The photodetector of claim 47 wherein said contact structure further includes a layer of interface metal interposing between said metallic material and said column of conductive material.

50. The photodetector of claim 49 wherein said layer of interface metal includes gold metal.

51. The photodetector of claim 50 wherein a layer of palladium metal is interposed between said interface layer of gold metal and said column of conductive material.

* * * * *